United States Patent
Deleu

(10) Patent No.: US 7,541,957 B2
(45) Date of Patent: Jun. 2, 2009

(54) ELECTRONIC FILTER DEVICE FOR THE RECEPTION OF TV SIGNALS

(75) Inventor: Stephen Deleu, Beervelde (BE)

(73) Assignee: Unitron, Poperinge (BE)

( * ) Notice: Subject to any disclaimer, the term of this patent is extended or adjusted under 35 U.S.C. 154(b) by 0 days.

(21) Appl. No.: 11/576,075

(22) PCT Filed: Sep. 26, 2005

(86) PCT No.: PCT/EP2005/054816

§ 371 (c)(1),
(2), (4) Date: Apr. 18, 2007

(87) PCT Pub. No.: WO2006/035015

PCT Pub. Date: Apr. 6, 2006

(65) Prior Publication Data

US 2008/0055142 A1    Mar. 6, 2008

(30) Foreign Application Priority Data

Sep. 27, 2004  (EP)  ................................. 04447213

(51) Int. Cl.
   *H03M 1/00* (2006.01)
(52) U.S. Cl. .................... 341/142; 368/68; 368/95; 348/731; 348/554; 455/260
(58) Field of Classification Search ......... 341/140–160; 368/68.95; 348/731, 553, 555, 558; 455/260
   See application file for complete search history.

(56) References Cited

U.S. PATENT DOCUMENTS

| 3,529,247 | A |   | 9/1970 | Nelson |  |
|---|---|---|---|---|---|
| 4,683,553 | A | * | 7/1987 | Mollier | 705/55 |
| 4,945,404 | A | * | 7/1990 | Miller | 348/22 |
| 5,337,338 | A | * | 8/1994 | Sutton et al. | 341/152 |
| 5,481,560 | A | * | 1/1996 | Potetz et al. | 341/53 |
| 5,764,165 | A | * | 6/1998 | Buch | 341/152 |
| 5,774,084 | A | * | 6/1998 | Brombaugh et al. | 341/152 |
| 6,172,633 | B1 |   | 1/2001 | Rodgers et al. |  |
| 6,636,727 | B2 | * | 10/2003 | Muschallik et al. | 455/260 |

FOREIGN PATENT DOCUMENTS

GB    2 272 341  A    5/1994

OTHER PUBLICATIONS

Patent Abstracts of Japan vol. 012, No. 492, Dec. 22, 1988, & JP 63 204159, Aug. 23, 1988.
Patent Abstracts of Japan, vol. 1995, No. 9, Oct. 31, 1995, & JP 07 147541, (Mitsubishi Electric Corp), Jun. 6, 1995.

* cited by examiner

*Primary Examiner*—Lam T Mai
(74) *Attorney, Agent, or Firm*—Browdy and Neimark, P.L.L.C.

(57) ABSTRACT

An electronic filter device for the reception of TV-signals, comprising a plurality of frequency determining elements settable by means of an analog setting voltage, a memory (2) for storing digital values representative of the analog setting voltages and conversion circuitry (11-14) for converting the digital values into the analog setting voltages. The conversion circuitry comprises a first part (11-13) for generating a digitally modulated signal for each digital value, the digitally modulated signal having a modulated characteristic representative of the digital value, and a second part (14) for converting each of the digitally modulated signals into the analog setting voltages.

24 Claims, 3 Drawing Sheets

ELECTRONIC FILTER DEVICE FOR THE RECEPTION OF TV SIGNALS

TECHNICAL FIELD

The present invention relates to an electronic filter device for the reception of TV-signals according to the preamble of claim 1.

BACKGROUND ART

In the 1980s, a fixed filter was commonly used to filter and combine different aerial signals onto 1 cable. Fixed, meaning the installer needed to replace the filter by a totally new filter if frequencies of the channels (or simply the whole application) changed.

In the 1990s, programmable filters came on the market, which could be reprogrammed by the installer on site to serve different frequencies or new applications, so obviating the need for replacement by a new filter. The filter was suitable for all possible applications at that time, so there was no need to develop, produce and store different versions.

One example of such a filter is described in GB-A-2272341. In order to filter the desired TV channels from the incoming signal, the device comprises a plurality of frequency determining elements (mostly varicaps) which are settable by means of analog setting voltages. In order to generate these voltages, digitally stored voltage values are converted to analog voltages by means of Digital-to-Analog Convertors (DAC), which are expensive components. To limit the number of DACs, a special algorithm is used in the device of GB-A-2272341: a smaller amount of DACs generates more analog voltages by multiplexing each DAC-output to several "analog memory locations" (which is for instance a sample-and-hold circuit) in a "dynamic memory", where the analog voltages are stored and passed on to the frequency determining elements.

The device known from GB-A-2272341 however has the disadvantage that, in order to keep the voltages in the dynamic memory at the desired level, a continuous refresh-algorithm is needed to connect the DAC-output at regular times to the analog memory locations. This continuous refreshing of the analog voltages demands a huge portion of the resources of the microcontroller. This results in the need of an oversized microcontroller, which again increases the cost of the device.

DISCLOSURE OF THE INVENTION

It is an aim of the present invention to provide an electronic filter device for the reception of TV-signals with alternative conversion circuitry to DACs, with which the need for an oversized microcontroller can be obviated.

This aim is achieved according to the invention with an electronic filter device showing the technical characteristics of the first claim.

The electronic filter device for the reception of TV-signals according to the invention comprises a plurality of frequency determining elements which are settable by means of an analog setting voltage. The device further comprises a memory in which digital values representative of the analog setting voltages are stored and conversion circuitry for converting the digital values into the analog setting voltages. The device is characterised in that the conversion circuitry comprises a first part for generating a digitally modulated signal for each digital value, the digitally modulated signal having a characteristic representative of the digital value, and a second part for converting each of the digitally modulated signals into the analog setting voltages.

The digitally modulated signals, which are generated by the first part of the conversion circuitry of the device according to the invention, are digital signals whose binary value changes between '0' and '1' in such a way, for example according to a regular pattern, that the signal carries a characteristic which represents the digital value from which the signal originates and which is interpretable. The characteristic can for example be a duty cycle, i.e. the time that the signal is '1' or the time that the signal is '0', divided by the period, or a frequency at which the signal changes between '1' and '0' and back, or any other characteristic which can be digitally modulated.

In the electronic filter device of the invention, a detour is used for converting the analog setting voltages from the digital values. The obvious way would be to use DACs (one for each voltage to be generated), but as mentioned this is undesirable in view of their cost. According to the invention, the digital values are first converted into digitally modulated signals, which are in turn converted into the analog setting voltages. The first part of the conversion circuitry adds some digital components to the device, but these are generally cheap and the digitally modulated signals generated by them are convertible into the analog setting voltages by means of less expensive components than DACs, such as for example resistors and capacitors. As a result of using the detour, each of the analog voltages can be generated by means of its own, dedicated part of the conversion circuitry, there is no longer a need to share different analog voltages on the same line, as is the case in the prior art device on the output of the DACs, nor to use a dynamic switch for connecting the right voltage to the right analog storage location in the dynamic memory. This eliminates the need for a complex refresh-algorithm and an oversized microcontroller.

Furthermore, since there is no longer a need to share different analog voltages on the same line, as is the case in the prior art device on the output of the DACs, nor to use a dynamic switch for connecting the right voltage to the right analog storage location in the dynamic memory, these rather expensive components can also be dispensed with, which can further involve a reduction in the cost of the device. The elimination of the continuous refreshing of the analog voltages also has the advantage that the voltages no longer show a ripple, which is being distributed over a big part of the printed circuit board, which is always present on voltages which need to be continuously refreshed. In this way, the need for additional filtering components for removing the ripple from the voltages and avoiding that a residue of the ripple appears on the TV-image is also avoided, which can further reduce the cost of the device of the invention.

Still further, since the first part of the conversion circuitry can be fully digital, integration of the components becomes an option and all or at least some of the components can be integrated into a single chip. This can further reduce the number of separate components in the device and consequently further reduce its price.

In a preferred embodiment of the electronic filter device of the invention, the first part of the conversion circuitry comprises a plurality of comparators, one for each digitally modulated signal, for comparing one of the digital values with a counter value, the counter value being delivered by a counter which is provided for repeatedly counting through a predetermined value range comprising all possible digital values. In this embodiment, each comparator outputs a '0' as long as its comparison condition is not fulfilled and a '1' when its comparison condition is fulfilled, or vice versa. Hence, a digitally modulated signal as defined above is generated with a duty cycle indicative of the digital value at the input of the comparator, and thus indicative of the analog setting voltage. This embodiment has the advantage of being a simple and straightforward solution for generating the digitally modulated signals from the digital values.

The counter can count upwards or downwards through its range. In order to obtain the repeated counting through the range, it can be periodically reset by a microcontroller of the device or it can function in an endless loop. The comparison condition can be "x smaller than y", "x smaller than or equal to y", "x greater than y" or "x greater than or equal to y". Instead of counter(s) and comparators, other components may also be used to generate the digitally modulated signals from the digital values.

The counter is preferably common for all comparators, so that only one counter value needs to be generated. Alternative solutions are that each comparator has its own counter or that counters are provided for groups of comparators. When the bit width of the digital values stored in the memory of the device is N, the comparators are at least N bits wide and the counter is provided for repeatedly counting between 0 and at least $2^N-1$ for covering all possible digital values.

The first part of the conversion circuitry preferably comprises a common register for storing copies of the digital values stored in the memory. In this way the memory is kept separate from the conversion circuitry and unintentional changes to the data can be avoided. The register is preferably common for all comparators, but separate registers for one comparator or groups of comparators are also possible. A further alternative is that the comparators are directly coupled to the memory.

In a preferred embodiment of the device of the invention, the first part of the conversion circuitry is integrated in a field programmable gate array (FPGA), a programmable logic device (PLD), a complex programmable logic device (CPLD), an application specific integrated circuit (ASIC), or any other like programmable integrated circuit known to the person skilled in the art. The FPGA is preferred for the reasons that it is the best available compromise between price and integratability and that it is becoming widely used in the field.

One or more of the following optional components of the device of the invention may be integrated along with the first part of the conversion circuitry into the same chip: a microcontroller, a PC-interface, an RF-detection circuit and/or user interface logic. The memory in which the digital values are stored may also be integrated into this chip.

The second part of the conversion circuitry preferably comprises a plurality of integrators, one for each digitally modulated signal. These integrators, which may conveniently be implemented in the form of RC-networks, generate the desired analog setting voltages from the digitally modulated signals. The integrators are preferred for reasons of being low-complex and cheap. Other possible circuits are filters or any other circuit which can make a relation between the duty cycle of a digitally modulated signal and the analog setting voltage.

The memory in which the digital values are stored is preferably a non-volatile memory, such as for example an EEPROM, so that the device is reprogrammable on site. In order to enable reprogramming on site, the device comprises a user interface for enabling a user to reprogram the digital values.

BRIEF DESCRIPTION OF THE DRAWINGS

The invention will be further elucidated by means of the following description and the appended figures.

MODES FOR CARRYING OUT THE INVENTION

Figure 1:
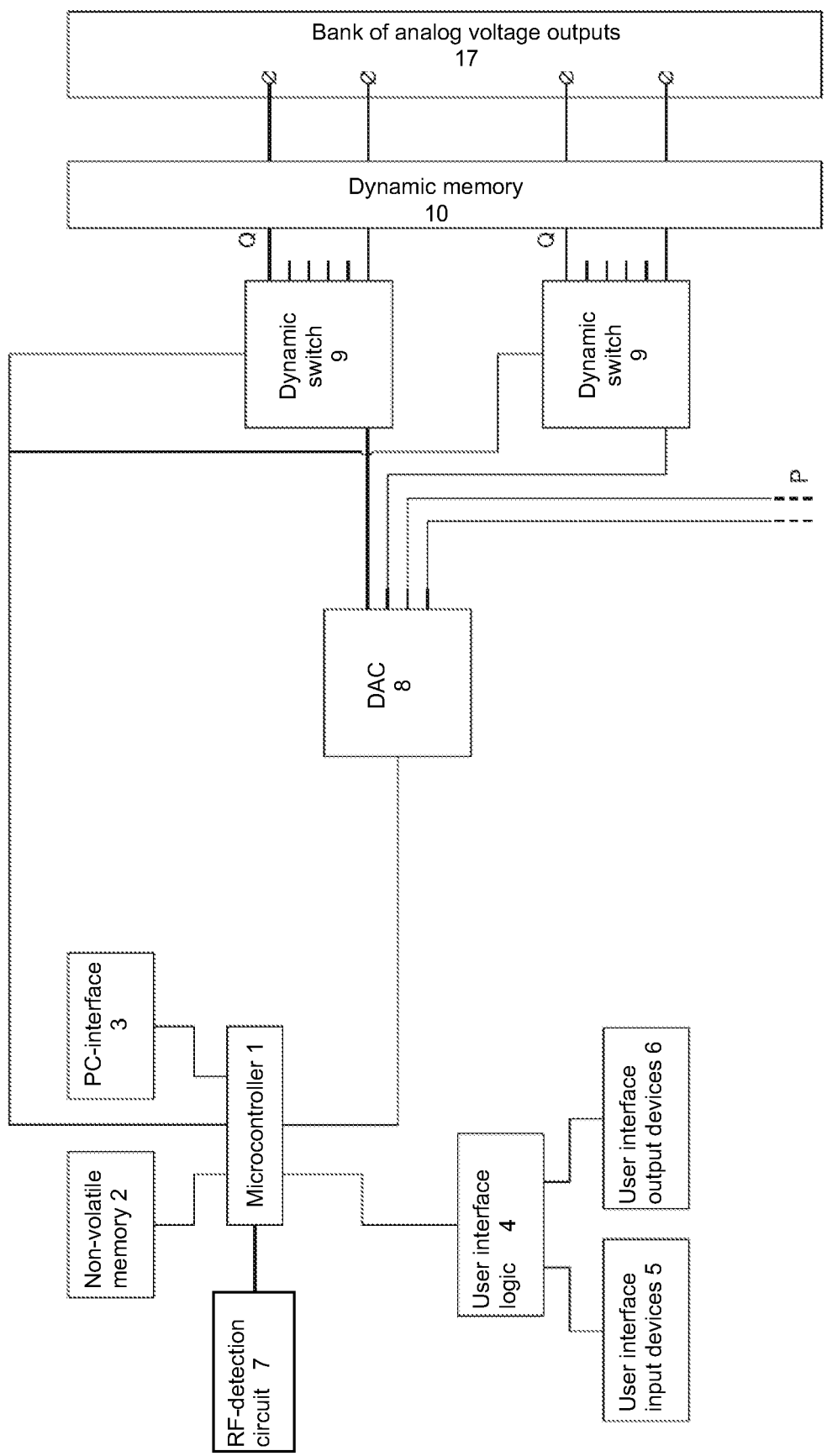
FIG. 1 shows a prior art electronic filter device.

The prior art device of FIG. 1 is the one which is known from GB-A-2272341. It comprises a microcontroller 1, a non-volatile memory (NVM) 2 for storing factory data and settings made in the field by the installer, a PC-interface 3, for instance for firmware upgrades or changing the settings of the device, a user-interface logic 4 with user-interface input devices 5 and user-interface output devices 6, an RF detection circuit 7 to detect the RF-level needed for an automatic equalization function, a plurality of DACs 8 to generate analog voltages, a plurality of switches 9 (or dynamic multiplexers), and a dynamic memory 10 with "analog storage locations" for storing the analog voltages. The analog voltages are supplied to a bank 17 of voltage outputs and are used for setting frequency determining elements of the RF-circuitry. In FIG. 1, the amount of DACs is P, the amount of dynamic switches is also P and the number of outputs per dynamic switch is Q. A complex dynamic algorithm, controlled by the microcontroller, is continuously active and synchronises the function of the DACs and the dynamic switches. At timeslot1, the DACs are generating the analog voltages for output1 and all dynamic switches are set to output1. At timeslot2, the DACs are generating the analog voltages for output2 and all dynamic switches are set to output2. This continues until timeslot Q where the last analog voltages are generated and directed to the last outputs. The result is that the dynamic memory now contains all PxQ analog voltages in PxQ storage locations, which are connected to the PxQ outputs in the bank 17. As the dynamic memory is not perfect and there is consumption on the analog voltages, the dynamic algorithm has to refresh all PxQ values by continuously repeating the actions done from the timeslot 1 till timeslot Q. It is clear this complex non-stop algorithm consumes a lot of resources from the microcontroller. Another disadvantage is the distribution of undesired high frequency signals, originating from the complex algorithm, between the DACs and the dynamic switches. There is no possibility to filter these undesired signals out, as it would completely destroy the complex algorithm, but nevertheless they are present on a big part of the PCB.

Figure 2:
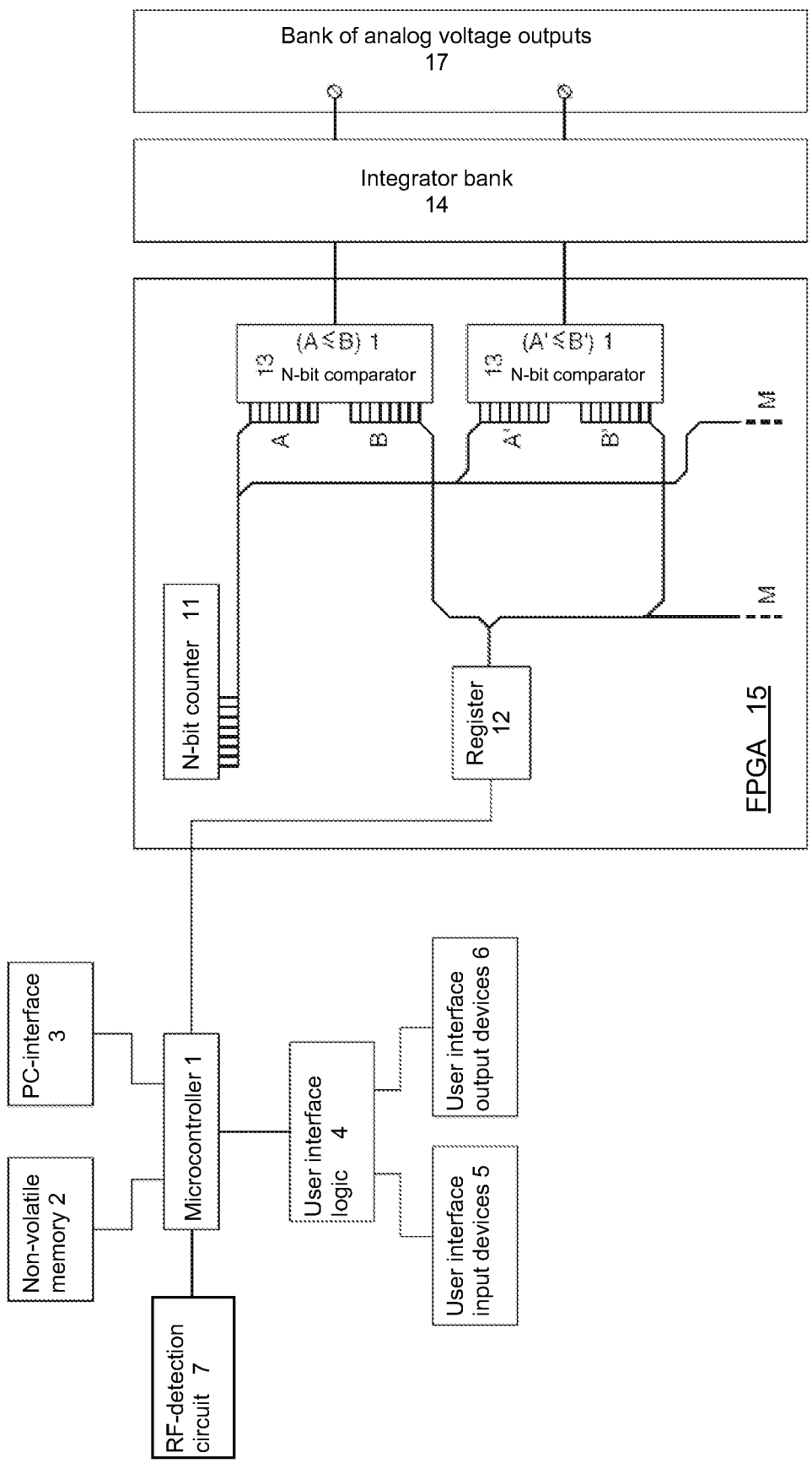
FIG. 2 shows a first preferred embodiment of the electronic filter device of the invention.

In FIG. 2, a first possible embodiment of the device of the invention is shown. This embodiment comprises the following components which are similar to those of the prior art device of FIG. 1: a microcontroller 1, a non-volatile memory 2 for storing all factory data and all settings made in the field by the installer, a PC-interface 3, for instance for firmware upgrades or changing the settings of the device, a user-interface logic 4 with user-interface input devices 5 and user-interface output devices 6, where items 4 through 6 are used for example for changing the settings, for showing an automatic equalization function, and any other possible functions, and an RF detection circuit 7 to detect the RF-level needed for the automatic equalization function. The device of FIG. 2 differs from that of FIG. 1 in the conversion circuitry, which comprises an N-bit counter 11, a register 12 comprising at least M×N bits, M comparators 13 (at least N-bit wide), an integrator bank 14 with M integrators (one for every comparator), and an output bank 17 where the M analog voltages are presented for use in the RF circuitry (not shown) of the device. The integrators 14 may conveniently be implemented as RC-networks, but other implementations are possible. The analog voltages which are generated are at least used for the frequency determining elements of the RF-circuitry (not shown), but may also be used for some other input or output circuitry and possibly also other components.

In the embodiment shown in FIG. 2, the user interface 4-6 is part of the electronic filter device. Alternatively, the user interface may also be disconnectable from the device.

The counter 11, register 12 and the comparators 13 form a first part of the conversion circuitry which is provided for converting the digital values stored in the memory 2 into digitally modulated signals having a duty cycle indicative of the digital value and thus the analog setting value.

The first part of the conversion circuitry operates as follows. The N-bit counter 11 is counting in an endless loop between 0 and $2^N-1$ and increases every time by 1 at the rate of the clock. When it arrives at $2^N-1$, it starts again at 0 in a non-stop repetitive process. At the same clock rate, this value of the N-bit counter is applied to inputs A, A', . . . of all M comparators 13. The register 12 contains at least M×N-bits sent once from the non-volatile memory 2 by the microcontroller 1 upon restart or reprogramming of the device, which can be triggered by an installer via the user-interface 4-6. So the register 12 stores a copy of the digital values stored in the non-volatile memory 2. The register 12 in turn applies this data to the input B, B', . . . of the respective comparator 13. As a result, each comparator 13 has 2 N-bit wide input signals which it compares at the rate of the clock. Suppose the condition which is considered by each comparator 13 is "A smaller than or equal to B". The first comparator 13 will then output a binary '1' as long as the value on input A, i.e. the counter value, is smaller than or equal to the value on input B, i.e. one of the digital values. Once the value on input A becomes greater than the value on input B, the comparator will output a binary '0'. In this way, a digitally modulated signal is generated with a duty cycle which is a representation of the digital value originating from the NVM 2. So the duty cycle is a digitally modulated characteristic which is linked to the stored digital value. As an alternative, the comparison condition may also be "A smaller than B", "A greater than B" or "A greater than or equal to B". Instead of counter(s) and comparators, other components may also be used to generate the digitally modulated signals from the digital values.

The integrators 14 form a second part of the conversion circuitry and are provided for converting the digitally modulated signals into the analog setting voltages. Instead of integrators 14, also filters or any other circuit which can make a relation between the duty cycle of the digitally modulated signal and the analog voltage can be used.

In the embodiment of FIG. 2, the register 12 and the counter 11 operate stand-alone, without needing control by the microcontroller 1. Only at discrete moments, such as startup or upon a change of the settings, the microcontroller 1 addresses the register 12. As a result, the microcontroller 1 does not need resources for performing a continuous refresh-algorithm as in the prior art.

The description above is an example, but surely not the only possible solution. Instead of a single counter, also a number of counters can be used. Similarly, also a number of registers can be used instead of a single one. In the extreme case, one counter and one register are used per comparator, where the counters can operate independently and unsynchronised from each other. The number of integrators or filters can be equal to the number of comparators, but also more or less. The counter(s) do not necessarily have to operate in an endless loop: other operation modes are possible, such as for example a periodical resetting by the microcontroller.

In an alternative embodiment (not shown), digitally modulated signals are generated by means of frequency-to-voltage converters. In this embodiment, the NVM can for example store a divider ratio of a clock rate for each voltage to be generated, which divider ratio is then used for generating an oscillating signal, in synchronisation with the clock signal of the device but at a lower frequency than the clock. This oscillating signal can be generated by means of a first, fully digital part of conversion circuitry. The oscillating signal is then supplied to the frequency-to-voltage converters, which form a second part of the conversion circuitry. In this embodiment, the stored divider ratio is thus also a digital value representative of the analog voltage to be generated. The oscillating signal is a digitally modulated signal as defined above, its frequency being the modulated characteristic which is linked to the stored digital value and thus the voltage to be generated. Further alternative embodiments are feasible.

As a result of using the comparators 13, register 12 and counter 11, the need of expensive DACs, and the space-consuming dynamic switches and dynamic memory is eliminated. Furthermore, integration of the components becomes an option. As there is now a fully digital circuit replacing the DAC, the way is open to integrate most of the digital circuits. This can be done in a PLD (programmable logic device), CPLD (complex programmable logic device), FPGA (field programmable gate array), ASIC (application specific integrated circuit), or other equivalent integrated circuits. There are such circuits available which have enough resources for integrating all comparators as well as the register and the counter, which is done in the embodiment of FIG. 2. For example, in an embodiment where 64 analog setting voltages are needed the N-bit counter 11, the register 12 with at least 64 N-bit words and at least 64 comparators 13 can be integrated into a single FPGA for generating these voltages. The number of voltages and consequently the size of the register and the number of comparator-circuits may of course vary depending on the needs and circumstances.

When an FPGA is used for the integration, different embodiments are possible. In the first embodiment which is shown in FIG. 2, the FPGA 15 is of the volatile type, which is why a separate NVM 2 is included for storing configuration bits for configuring the FPGA 15. This NVM 2 is also the one where the factory data and the digital values representative of the analog setting voltages are stored, but a separate NVM for the configuration bits is also possible. During start-up the FPGA 15 configures itself by downloading its program from the NVM.

Figure 3:
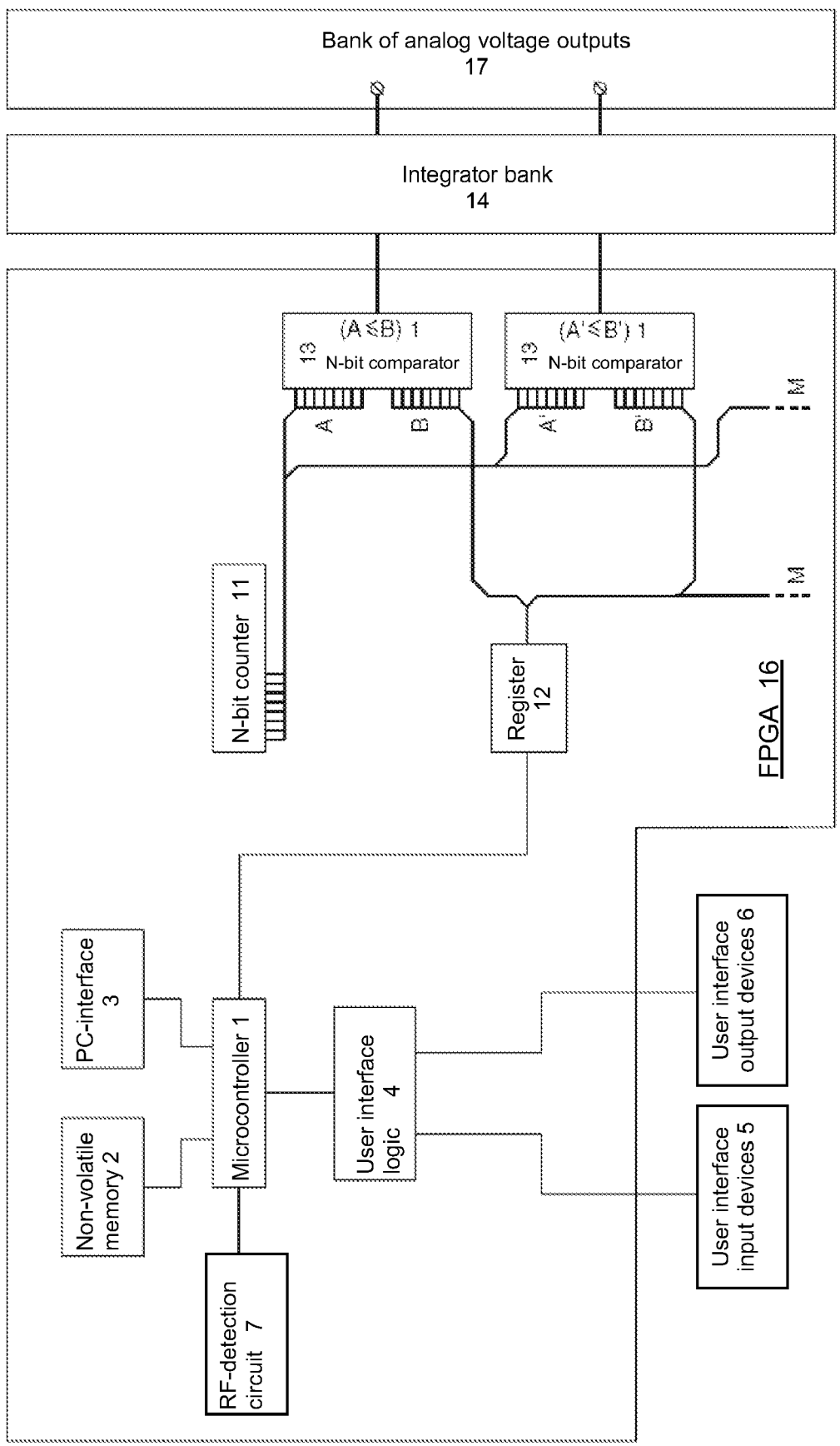
FIG. 3 shows a second preferred embodiment of the electronic filter device of the invention.

In an alternative embodiment which is shown in FIG. 3, the FPGA 16 is of the non-volatile type, meaning it has an embedded NVM so there is no need to store the configuration bits in a separate NVM. In this embodiment, even the rest of the data can be stored inside the FPGA 16.

In the embodiment of FIG. 3 even more is integrated into the FPGA 16, namely the user-interface logic 4, to which both input- and output devices 5, 6 can be connected either permanently or removably, the microcontroller 1, the RF detection circuit 7 and the PC-interface 3. Further digital components may also be integrated into the FPGA. In FIG. 3, all digital circuitry is integrated, even circuitry with analog inputs or outputs, leading to an electronic filter device which can be manufactured at a very low cost.

The advantages of the device of FIG. 2 or 3 in comparison with that of FIG. 1 are numerous. As already mentioned, a first benefit is the elimination of the complex refresh-algorithm, which has been replaced by a simpler straight-forward algorithm. The microcontroller 1 is no longer continuously working on the algorithm, the only time the microcontroller needs to coordinate the generation of the analog voltages, is at start-up or when the settings of the electronic filter device are being changed. This can be done by means of a microcontroller 1 with much less resources, hence a much cheaper one.

A second advantage is that changes in the design can be made in a much easier way compared to the prior art. In the device of FIG. 2 or 3, the microcontroller 1 is mainly occupied with the communication triggered by a non-continuous event, like an installer changing the settings. In the prior art device of FIG. 1 the microcontroller had to organize both the continuous process (complex algorithm) and non-continuous events (like a change of settings). When an event occurred and the microcontroller needed for instance to monitor the input user-interface device, the complex algorithm was still running, making the firmware inside the microcontroller complex and difficult to change. As a result of the elimination of the refresh-algorithm, changes on the product (improvements, updates, new versions, ... ) can be implemented faster and easier.

A next advantage is the possibility of integration of multiple components, leading to cheaper designs. This works in two ways: on the one hand the number of components is reduced and on the other hand space is saved. Less occupied space means smaller PCBs, smaller housings, . . . , hence cheaper and commercially more attractive products.

Because of the absence of the dynamic switch in the devices of FIGS. 2 and 3, there is also no longer a source for causing ripple which can lead to disturbances in the RF-signal. In the prior art device of FIG. 1, special attention had to be given to this EMC-subject, as the dynamic algorithm with its high frequency transitions was distributed over a big part of the PCB, causing it to radiate. In the devices of FIGS. 2 and 3, the dynamic algorithm, responsible for a substantial part of the EMC-problems, is eliminated and replaced by a (static) algorithm running inside the FPGA component, making it easy to filter all unwanted spikes directly at the output of the component. Any radiation is contained inside the component and will substantially not influence the RF-signal. As an extra advantage (if necessary) the microcontroller 1 (also responsible for a part of the radiation) can run on a slower clock frequency, further decreasing the risk of disturbing radiation.

The devices of FIGS. 2 and 3 further show an increased upgradability. On the software level, these devices are at least as flexible as the prior art device of FIG. 1: new settings of the frequency determining elements of the hardwired filters can be obtained through changing the setting voltages. But in devices of FIGS. 2 and 3, the hardware characteristics can be changed: new features can be added, stronger microcontrollers can be implemented, a higher accuracy can be obtained by increasing the number of bits in the counter, register and comparators, and so on.

A next advantage is a reduced time for generating the factory data at the production stage. The DAC and the dynamic refresh-algorithm of the prior art device of FIG. 1 slow down this procedure because a few DACs, through the multiplexing system, have to supply a lot of analog voltages. With the devices of FIGS. 2 and 3, the speed can be increased as all analog voltages can be generated simultaneously. A huge benefit of this increased speed lies in the calibration of the NVM at the production stage. The speed of the testequipment at the production stage is no longer limited by the speed of the DAC and the multiplexing algorithm, which can reduce the production time and realise a reduction of the production costs.

REFERENCE LIST

1 Microcontroller
2 Non-volatile memory
3 PC-interface
4 User interface logic
5 User interface input devices
6 User interface output devices
7 RF-detection circuit
8 DAC
9 Dynamic switch
10 Dynamic memory
11 N-bit counter
12 Register (N×M bit)
13 N-bit comparator
14 Integrator bank
15 FPGA
16 FPGA
17 Bank of analog voltage outputs

The invention claimed is:

1. An electronic filter device for the reception of TV-signals, comprising:
 a plurality of frequency determining elements, each frequency determining element being settable by means of an analog setting voltage,
 a memory (2) for storing digital values representative of the analog setting voltages and
 conversion circuitry (11-14) for converting the digital values into the analog setting voltages,
 wherein the conversion circuitry comprises a first part (11-13) for generating a digitally modulated signal for each digital value, the digitally modulated signal having a modulated characteristic representative of the digital value, and a second part (14) for converting each of the digitally modulated signals into the analog setting voltages.

2. An electronic filter device according to claim 1, wherein the modulated characteristic is a duty cycle.

3. An electronic filter device according to claim 1, wherein the modulated characteristic is a frequency.

4. An electronic filter device according to claim 1, wherein the first part (11-13) of the conversion circuitry comprises a plurality of comparators (13), one for each digitally modulated signal, for comparing one of the digital values with a counter value, the counter value being delivered by a counter (11) which is provided for repeatedly counting through a predetermined value range.

5. An electronic filter device according to claim 4, wherein the counter (11) is common for a number of or all comparators (13).

6. An electronic filter device according to claim 5, wherein the comparators (13) are at least N bits wide and wherein the counter (11) is provided for repeatedly counting between 0 and at least $2^N - 1$, N being the bit width of the digital values.

7. An electronic filter device according to claim 1, wherein the first part (11-13) of the conversion circuitry comprises at least one register (12), common for a number of or all comparators, for storing copies of the digital values stored in the memory (2).

8. An electronic filter device according to claim 1, wherein the first part (11-13) of the conversion circuitry is integrated in a field programmable gate array (15; 16).

9. An electronic filter device according to claim 8, wherein the field programmable gate array (15; 16) further integrates one or more of the following: a microcontroller (1), a PC-interface (3), an RF-detection circuit (7), user interface logic (4) and/or the memory (2) in which the digital values are stored.

10. An electronic filter device according to claim 1, wherein the second part (14) of the conversion circuitry comprises a plurality of integrators, one for each digitally modulated signal.

11. An electronic filter device according to claim 10, wherein the integrators (14) are implemented as RC-networks.

12. An electronic filter device according to claim 1, wherein the memory (2) is a non-volatile memory and wherein the device comprises a user interface (5, 6) for enabling a user to reprogram the digital values.

13. An electronic filter device for the reception of TV-signals, comprising:
a plurality of frequency determining elements, each frequency determining element being settable by means of an analog setting voltage,
a memory (2) for storing digital values representative of the analog setting voltages and a field programmable gate array (15; 16) integrated conversion circuitry (11-14) for converting the digital values into the analog setting voltages,
wherein the integrated conversion circuitry comprises a first part (11-13) for generating a digitally modulated signal for each digital value, the digitally modulated signal having a modulated characteristic representative of the digital value, and a second part (14) for converting each of the digitally modulated signals into the analog setting voltages.

14. An electronic filter device according to claim 13, wherein the field programmable gate array (15; 16) further integrates said memory (2) in which the digital values are stored.

15. An electronic filter device according to claim 13, wherein the field programmable gate array (15; 16) further integrates one or more of the following: a microcontroller (1), a PC-interface (3), an RF-detection circuit (7) and/or user interface logic (4).

16. An electronic filter device according to claim 13, wherein the modulated characteristic is a duty cycle.

17. An electronic filter device according to claim 13, wherein the modulated characteristic is a frequency.

18. An electronic filter device according to claim 13, wherein the first part (11-13) of the integrated conversion circuitry comprises a plurality of comparators (13), one for each digitally modulated signal, for comparing one of the digital values with a counter value, the counter value being delivered by a counter (11) which is provided for repeatedly counting through a predetermined value range.

19. An electronic filter device according to claim 18, wherein the counter (11) is common for a number of or all comparators (13).

20. An electronic filter device according to claim 19, wherein the counter (11) is integrated in the field programmable gate array (15; 16).

21. An electronic filter device according to claim 19, wherein the comparators (13) are at least N bits wide and wherein the counter (11) is provided for repeatedly counting between 0 and at least $2^N-1$, N being the bit width of the digital values.

22. An electronic filter device according to claim 13, wherein the first part (11-13) of the integrated conversion circuitry comprises at least one register (12), common for a number of or all comparators, for storing copies of the digital values stored in the memory (2).

23. An electronic filter device according to claim 13, wherein the second part (14) of the integrated conversion circuitry comprises a plurality of integrators, one for each digitally modulated signal.

24. An electronic filter device according to claim 13, wherein the memory (2) is a non-volatile memory and wherein the device comprises a user interface (5, 6) for enabling a user to reprogram the digital values.

* * * * *